(12) United States Patent
On

(10) Patent No.: US 12,543,344 B2
(45) Date of Patent: Feb. 3, 2026

(54) THIN FILM TRANSISTOR AND DISPLAY DEVICE COMPRISING THE SAME

(71) Applicant: LG DISPLAY CO., LTD., Seoul (KR)

(72) Inventor: Nuri On, Paju-si (KR)

(73) Assignee: LG Display Co., Ltd. (KR)

( * ) Notice: Subject to any disclaimer, the term of this patent is extended or adjusted under 35 U.S.C. 154(b) by 610 days.

(21) Appl. No.: 17/897,795

(22) Filed: Aug. 29, 2022

(65) Prior Publication Data

US 2023/0072208 A1 Mar. 9, 2023

(30) Foreign Application Priority Data

Sep. 3, 2021 (KR) .................. 10-2021-0117935
Dec. 31, 2021 (KR) .................. 10-2021-0194209

(51) Int. Cl.
*H10D 30/67* (2025.01)
*H10D 1/66* (2025.01)
*H10K 59/122* (2023.01)

(52) U.S. Cl.
CPC ............ *H10D 30/673* (2025.01); *H10D 1/66* (2025.01); *H10D 30/6729* (2025.01); *H10D 30/6755* (2025.01); *H10D 30/6739* (2025.01); *H10K 59/122* (2023.02)

(58) Field of Classification Search
CPC .... H10D 30/673; H10D 1/66; H10D 30/6729; H10D 30/6755; H10D 30/6739; H10D 30/6723; H10D 30/6757; H10K 59/122; H10K 59/12
See application file for complete search history.

(56) References Cited

U.S. PATENT DOCUMENTS

| 7,995,154 | B2* | 8/2011 | Kim ...................... G02F 1/1368 |
| | | | 349/42 |
| 8,841,666 | B2 | 9/2014 | Kim |
| 10,096,715 | B2* | 10/2018 | Yamazaki .......... H10D 30/6704 |
| 10,797,146 | B2* | 10/2020 | Bang ...................... H10D 86/60 |
| 11,695,016 | B2* | 7/2023 | Daitoh ................... H10D 86/60 |
| | | | 257/59 |
| 2016/0284862 | A1 | 9/2016 | Yamazaki et al. |

FOREIGN PATENT DOCUMENTS

| KR | 2014-0064477 A | 5/2014 |
| KR | 20190128027 A | 11/2019 |
| KR | 20200046837 A | 5/2020 |

OTHER PUBLICATIONS

Office Action in Korean Appln. No. 10-2021-0194209, mailed on Aug. 20, 2025, 15 pages (with English translation).

* cited by examiner

*Primary Examiner* — Tan N Tran
(74) *Attorney, Agent, or Firm* — Fish & Richardson P.C.

(57) ABSTRACT

A thin film transistor and a display device comprising the same are provided, in which the thin film transistor includes an active layer, a metal oxide layer on the active layer, a gate insulating layer on the metal oxide layer, and a gate electrode on the gate insulating layer, wherein the metal oxide layer is disposed between the active layer and the gate insulating layer to contact the active layer and the gate insulating layer.

10 Claims, 10 Drawing Sheets

THIN FILM TRANSISTOR AND DISPLAY DEVICE COMPRISING THE SAME

CROSS-REFERENCE TO RELATED APPLICATION

This application claims the priorities of Korean Patent Application No. 10-2021-0117935 filed on Sep. 3, 2021 and Korean Patent Application No. 10-2021-0194209 filed on Dec. 31, 2021, which are hereby incorporated by reference in their entirety.

BACKGROUND

Field of the Disclosure

The present disclosure relates to a thin film transistor and a display device comprising the same.

Description of the Background

Since a thin film transistor may be manufactured on a glass substrate or a plastic substrate, the thin film transistor has been widely used as a switching element or a driving element of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer, based on a material constituting the active layer.

Among them, since an oxide semiconductor thin film transistor (TFT), which has high mobility and has a large resistance change in accordance with an oxygen content, it has an advantage in that desired properties may easily be obtained. Further, since an oxide constituting an active layer may be grown at a relatively low temperature during a process of manufacturing the oxide semiconductor thin film transistor, the manufacturing cost of the oxide semiconductor thin film transistor is reduced. In view of the properties of the oxide, since an oxide semiconductor is transparent, it is favorable to embody a transparent display. However, the oxide semiconductor thin film transistor has a problem in that stability and electron mobility are deteriorated as compared with the polycrystalline silicon thin film transistor.

Recently, with high quality and high resolution of a display device, a large number of thin film transistors are disposed in the display device. When the thin film transistors of the display device are driven to be unstable or their quality is non-uniform, display quality may be deteriorated. Therefore, it is required that the thin film transistors should have excellent stability and uniform quality.

SUMMARY

Accordingly, the present disclosure is to provide a thin film transistor having excellent stability and excellent quality uniformity.

The present disclosure is also to provide a method of improving stability and quality uniformity of a thin film transistor by disposing a metal oxide layer on a surface of an active layer of the thin film transistor, particularly forming a metal oxide layer by a transition metal.

The present disclosure is also to provide a display device comprising a thin film transistor having excellent stability.

The present disclosure as mentioned above, additional features of the present disclosure will be clearly understood by those skilled in the art from the following description of the present disclosure.

In accordance with an aspect of the present disclosure, a thin film transistor comprises an active layer, a metal oxide layer on the active layer, a gate insulating layer on the metal oxide layer, and a gate electrode on the gate insulating layer, wherein the metal oxide layer is disposed between the active layer and the gate insulating layer to contact the active layer and the gate insulating layer.

The metal oxide layer may have a thickness of 1 nm to 3 nm.

The metal oxide layer may include at least one of aluminum (Al), titanium (Ti), tantalum (Ta), zirconium (Zr), hafnium (Hf), vanadium (V), niobium (Nb), rubidium (Rb), cesium (Cs), magnesium (Mg), calcium (Ca), strontium (Sr), lanthanum (La) or palladium (Pd).

The metal oxide layer may cover at least a portion of an upper surface of the active layer.

The metal oxide layer may cover an upper surface and sides of the active layer.

The active layer may include a channel portion, a first connection portion and a second connection portion, and the metal oxide layer may be disposed between the channel portion and the gate insulating layer.

The metal oxide layer may not be disposed on the first connection portion and the second connection portion.

The thin film transistor may further comprise a source electrode electrically connected to the active layer, and a drain electrode spaced apart from the source electrode and electrically connected to the active layer, wherein at least one of the source electrode or the drain electrode may be in contact with the metal oxide layer and the active layer by a metal insulator semiconductor (MIS) contact.

The thin film transistor may further comprise a source electrode and a drain electrode, which are spaced apart from each other and electrically connected to the active layer, wherein at least one of the source electrode or the drain electrode may be in contact with the active layer through a contact hole formed in the metal oxide layer.

The thin film transistor may further comprise a metal layer disposed on a metal oxide layer that overlaps the first connection portion and the second connection portion.

The metal layer may have a thickness of 4 nm to 50 nm.

The active layer may include a metal oxide semiconductor material.

The active layer may include a first oxide semiconductor layer, and a second oxide semiconductor layer on the first oxide semiconductor layer, wherein the second oxide semiconductor layer may have mobility greater than that of the first oxide semiconductor layer.

The active layer may further include a third oxide semiconductor layer on the second oxide semiconductor layer.

In accordance with another aspect of the present disclosure, the above and other features can be accomplished by the provision of a display device comprising the above thin film transistor.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
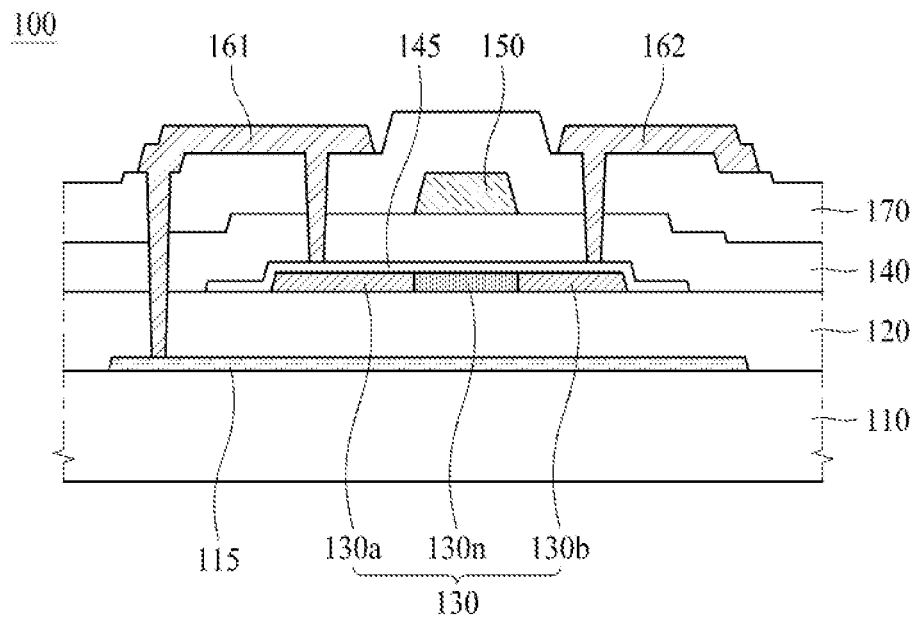
FIG. 1 is a cross-sectional view illustrating a thin film transistor according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

In the drawings, the same or similar elements are denoted by the same reference numerals even though they are depicted in different drawings.

In the aspects of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In some aspects of the present disclosure, for convenience of description, a source region is distinguished from a source electrode, and a drain region is distinguished from a drain electrode. However, the aspects of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor 100 according to one aspect of the present disclosure.

The thin film transistor 100 according to one aspect of the present disclosure includes an active layer 130, a metal oxide layer 145, a gate insulating layer 140 and a gate electrode 150.

Referring to FIG. 1, the active layer 130 is disposed on a substrate 110.

The substrate 110 may include a glass substrate or a plastic substrate. The plastic substrate may be a flexible transparent plastic such as polyimide. When polyimide is used as the substrate 110, a heat-resistant polyimide capable of enduring a high temperature may be used considering that a high temperature deposition process is performed on the substrate 110.

A light shielding layer 115 may be disposed on the substrate 110.

The light shielding layer 115 may shield light incident from the outside to protect a thin film transistor TFT. The light shielding layer 115 may be made of a material having light shielding characteristics. According to one aspect of the present disclosure, the light shielding layer 115 may have electrical conductivity.

The light shielding layer 115 may be electrically connected to one of a source electrode 161 and a drain electrode 162. Also, the light shielding layer 115 may be electrically connected to the gate electrode 150.

A buffer layer 120 is disposed on the light shielding layer 115. The buffer layer 120 may be made of an insulating material. For example, the buffer layer 120 may include at least one of a silicon oxide, a silicon nitride or an insulating material such as a metal-based oxide. The buffer layer 120 may have a single layered structure, or may have a multi-layered structure.

The buffer layer 120 may protect the active layer 130 by blocking the air and water. Also, an upper surface of the substrate 110 on which the light shielding layer 115 is disposed may be uniform by the buffer layer 120.

Referring to FIG. 1, the active layer 130 of the thin film transistor 100 may be disposed on the buffer layer 120.

According to one aspect of the present disclosure, the active layer 130 may be formed of a semiconductor material. The active layer 130 may include, for example, an oxide semiconductor material.

The oxide semiconductor material may include, for example, one of an IZO(InZnO)-based oxide semiconductor material, an IGO(InGaO)-based oxide semiconductor material, an ITO(InSnO)-based oxide semiconductor material, an IGZO(InGaZnO)-based oxide semiconductor material, an IGZTO(InGaZnSnO)-based oxide semiconductor material, a GZTO(GaZnSnO)-based oxide semiconductor material, a GZO(GaZnO)-based oxide semiconductor material, an ITZO(InSnZnO)-based semiconductor material, and a FIZO (FeInZnO)-based oxide semiconductor material, or a combination of at least two thereof, but one aspect of the present disclosure is not limited thereto. The active layer 130 may be made of another oxide semiconductor material known in the art.

The active layer 130 may include a channel portion 130n, a first connection portion 130a and a second connection portion 130b. The first connection portion 130a is connected to one side of the channel portion 130n, and the second connection portion 130b is connected to the other side of the channel portion 130n.

The channel portion 130n overlaps the gate electrode 150.

The first connection portion 130a and the second connection portion 130b may be formed by selective conductorization of the active layer 130 made of a semiconductor material. For example, the active layer 130 may be selectively conductorized by doping using the gate electrode 150 as a mask. As a result, the first connection portion 130a and the second connection portion 130b may be formed. For example, the active layer 130 may be selectively conductorized by ion doping using a dopant.

However, one aspect of the present disclosure is not limited to the above example, and the active layer 130 may be selectively conductorized in the process of patterning the gate insulating layer 140. For example, the active layer 130 may be selectively conductorized during a dry etching process.

The first connection portion 130a and the second connection portion 130b have electrical conductivity more excellent than that of the channel portion 130n. Therefore, each of the first connection portion 130a and the second connection portion 130b may serve as a line.

Referring to FIG. 1, the metal oxide layer 145 is disposed on the active layer 130. The gate insulating layer 140 may be disposed on the metal oxide layer 145, and the gate electrode 150 may be disposed on the gate insulating layer 140. The metal oxide layer 145 may be disposed between the active layer 130 and the gate insulating layer 140 to contact the active layer 130 and the gate insulating layer 140.

Referring to FIG. 1, the metal oxide layer 145 may be disposed between the active layer 130 and the gate electrode 150.

The metal oxide layer 145 includes a metal. The metal oxide layer 145 may include a different kind of metal from the active layer 130. The metal oxide layer 145 may include a transition metal.

According to one aspect of the present disclosure, the metal oxide layer 145 may include at least one of aluminum (Al), titanium (Ti), tantalum (Ta), zirconium (Zr), hafnium (Hf), vanadium (V), niobium (Nb), rubidium (Rb), cesium (Cs), magnesium (Mg), calcium (Ca), strontium (Sr), lanthanum (La) or palladium (Pd). Particularly, the metal oxide layer 145 may include at least one of aluminum (Al), titanium (Ti) or tantalum (Ta).

According to one aspect of the present disclosure, the metal oxide layer 145 may serve to protect the active layer 130. The metal oxide layer 145 may cover at least a portion of the active layer 130.

Referring to FIG. 1, the metal oxide layer 145 may cover an upper surface and sides of the active layer 130. According to one aspect of the present disclosure, the upper surface of the active layer 130 refers to a surface of the active layer 130 in a direction toward the gate electrode 150, and a lower surface of the active layer 130 refers to a surface of the active layer 130 in a direction toward the substrate 110. The sides of the active layer 130 refer to surfaces between the upper surface and the lower surface of the active layer 130. The metal oxide layer 145 may be in contact with the upper surface and the sides of the active layer 130 to protect the active layer 130.

The metal oxide layer 145 may be extended to an upper portion of the buffer layer 120 as well as the upper surface and the sides of the active layer 130. The metal oxide layer 145 may be patterned or not. The metal oxide layer 145 may be patterned to cover only the active layer 130 and a peripheral area of the active layer 130. Also, the metal oxide layer 145 may be disposed over the entire surface on the substrate 110.

According to one aspect of the present disclosure, the metal oxide layer 145 may serve to complement the gate insulating layer 140. Therefore, the metal oxide layer 145 may be referred to as an inter GI layer of the gate insulating layer 140. In this case, GI denotes the gate insulating layer 140.

The metal oxide layer 145 may have a very thin thickness so as to protect the active layer 130 and at the same time not to damage the electrical characteristics of the active layer 130. For example, the metal oxide layer 145 may have a thickness of 1 nm to 3 nm. According to one aspect of the present disclosure, the metal oxide layer 145 may have a thickness of 1 nm to 3 nm on the channel portion 130n of the active layer 130.

According to one aspect of the present disclosure, the metal oxide layer 145 in the entire area above the active layer 130 may have a thickness of 1 nm to 3 nm. In addition, the metal oxide layer 145 may have a thickness of 1 nm to 3 nm in the entire area above the substrate 110.

According to one aspect of the present disclosure, the metal oxide layer 145 having a thickness of 1 nm to 3 nm may be formed by an atomic layer deposition (ALD) process or a plasma-enhanced chemical vapor deposition (PECVD) method. The metal oxide layer 145 may be formed in such a manner that a metal is deposited by the ALD or PECVD method and oxidized. In an embodiment, the side surfaces of the active layer 130 may be inclined surfaces. For example, as shown in FIG. 1, the width of the active layer 130 may decrease in a direction from the lower surface to the upper surface of the active layer 130. In this case, it is easier for the metal oxide layer 145 to be deposited on the side surfaces of the active layer 130.

The metal oxide layer 145 may protect the active layer 130 by blocking hydrogen (H), oxygen ($O_2$) or water ($H_2O$) flowing from the outside although it is thin. In particular, the metal oxide layer 145 may prevent hydrogen (H) of the gate insulating layer 140 or another insulating layer from being permeated into the active layer 130, thereby preventing hydrogen (H) from affecting the active layer 130. The metal oxide layer 145 may serve as a blocking layer.

As the metal oxide layer 145 effectively blocks hydrogen together with the gate insulating layer 140, a conductorization permeation depth may be prevented from being unnecessarily extended from the channel portion 130n of the active layer 130. As a result, a process error may be avoided during a design and manufacturing process of the active layer 130 and the channel portion 130n. Therefore, the channel portion 130n does not need to be designed to be longer than necessary, and even though the channel portion 130n is designed to be short as necessary, the thin film transistor 100 may maintain excellent driving characteristics.

According to one aspect of the present disclosure, oxygen vacancy may be partially generated in the active layer 130 by a metal included in the metal oxide layer 145. Therefore, a carrier may be supplied to the channel portion 130n of the active layer 130 by the metal oxide layer 145, and as a result, mobility of the active layer 130 may be improved.

In addition, the carrier may be supplied to the active layer 130 by the metal included in the metal oxide layer 145. Therefore, conductorization may be efficiently performed during selective conductorization for the active layer 130, such as ion doping or dry etching. As a result, the first connection portion 130a and the second connection portion 130b may be easily formed.

The gate insulating layer 140 is disposed on the metal oxide layer 145. The gate insulating layer 140 may include at least one of a silicon oxide, a silicon nitride or a metal-based oxide. The gate insulating layer 140 may have a single layered structure, or may have a multi-layered structure. The gate insulating layer 140 protects the channel portion 130n.

Referring to FIG. 1, the gate insulating layer 140 may fully cover the upper portion of the substrate 110, but one aspect of the present disclosure is not limited thereto. The gate insulating layer 140 may be patterned (see FIGS. 2A and 2B).

The gate electrode 150 is disposed on the gate insulating layer 140. The gate electrode 150 is spaced apart from the active layer 130 and at least partially overlaps the active layer 130. At least a portion of the gate electrode 150 overlaps the channel portion 130n of the active layer 130.

The gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 150 may have a multi-layered structure that includes at least two conductive layers having their respective physical properties different from each other.

An interlayer insulating layer 170 is disposed on the gate electrode 150. The interlayer insulating layer 170 may include at least one of a silicon oxide, a silicon nitride or an insulating material such as a metal-based oxide. The interlayer insulating layer 170 may have a single layered structure, or may have a multi-layered structure.

A source electrode 161 and a drain electrode 162 may be disposed on the interlayer insulating layer 170. The source electrode 161 is in contact with the active layer through a contact hole. The drain electrode 162 is spaced apart from the source electrode 161 and contacts the active layer 130. Also, the source electrode 161 may be connected to the light shielding layer 115 below the active layer 130 through the contact hole.

The source electrode 161 and the drain electrode 162 may be made of a conductive material. In one aspect of the present disclosure, the source electrode 161 and the drain electrode 162 are distinguished from each other for convenience. Therefore, the source electrode 161 and the drain electrode 162 may be exchanged.

According to one aspect of the present disclosure, at least one of the source electrode 161 or the drain electrode 162 may contact the metal oxide layer 145 and the active layer 130 by a metal insulator semiconductor (MIS) contact.

In detail, the metal insulator semiconductor (MIS) contact may be formed among the source electrode 161, the metal oxide layer 145 and the active layer 130. As a result, even though the source electrode 161 and the active layer 130 are not in direct contact with each other with the metal oxide layer 145 interposed therebetween, an electrical connection between the source electrode 161 and the active layer 130 may be made.

Also, the MIS contact may be formed among the drain electrode 162, the metal oxide layer 145 and the active layer 130. As a result, even though the drain electrode 162 and the active layer 130 are not in direct contact with each other with the metal oxide layer 145 interposed therebetween, an electrical connection between the drain electrode 162 and the active layer 130 may be made.

However, one aspect of the present disclosure is not limited to the above example, and the source electrode 161 and the drain electrode 162 may be in direct contact with the active layer 130. For example, a contact hole may be formed in the metal oxide layer 145 so that each of the source electrode 161 and the drain electrode 162 may be in direct contact with the active layer 130.

Figure 2A:
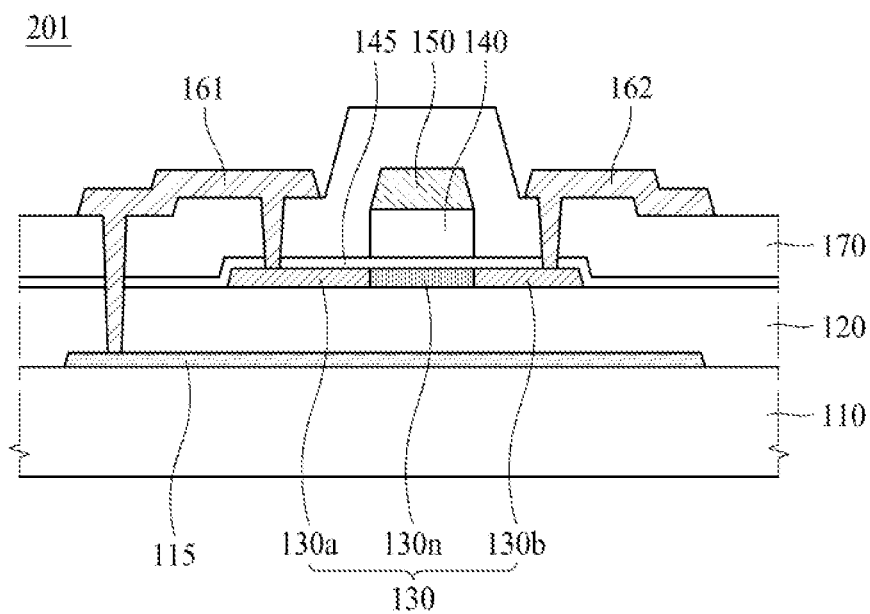
FIGS. 2A and 2B are cross-sectional views illustrating a thin film transistor according to another aspect of the present disclosure.
Figure 2B:
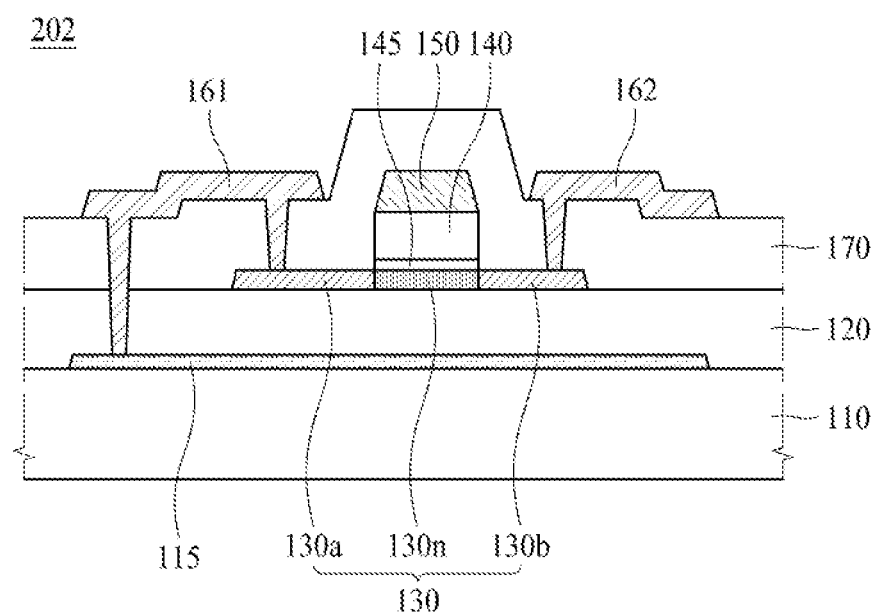

FIGS. 2A and 2B are cross-sectional views illustrating thin film transistors 201 and 202, respectively, according to another aspect of the present disclosure. In order to avoid redundancy, the description of the elements already described as above will be omitted.

Referring to FIG. 2A, the gate insulating layer 140 may be patterned. In detail, the gate insulating layer 140 may be patterned to correspond to the gate electrode 150.

When the gate insulating layer 140 is patterned, the active layer 130 may be selectively conductorized so that the first connection portion 130a and the second connection portion 130b may be formed, another aspect of the present disclosure is not limited thereto. The active layer 130 may be selectively conductorized by ion doping or another method known in the art, so that the first connection portion 130a and the second connection portion 130b may be formed.

Referring to FIG. 2A, the metal oxide layer 145 may be disposed to be extended from the upper surface and the sides of the active layer 130 to the upper portion of the buffer layer 120.

Referring to FIG. 2A, the source electrode 161 may be in contact with the active layer 130 through a contact hole formed in the interlayer insulating layer 170 and the metal oxide layer 145. The drain electrode 162 may be in contact with the active layer 130 through another contact hole formed in the interlayer insulating layer 170 and the metal oxide layer 145.

Referring to FIG. 2B, the metal oxide layer 145 may be removed from other areas except the channel portion 130n. The metal oxide layer 145 may be disposed between the channel portion 130n of the active layer 130 and the gate insulating layer 145.

In the thin film transistor 202 of FIG. 2B, unlike the thin film transistor 201 of FIG. 2A, the metal oxide layer 145 may not be disposed on the first connection portion 130a and the second connection portion 130b. In this case, the first connection portion 130a and the second connection portion 130b can be conductorized more easily.

Figure 3:
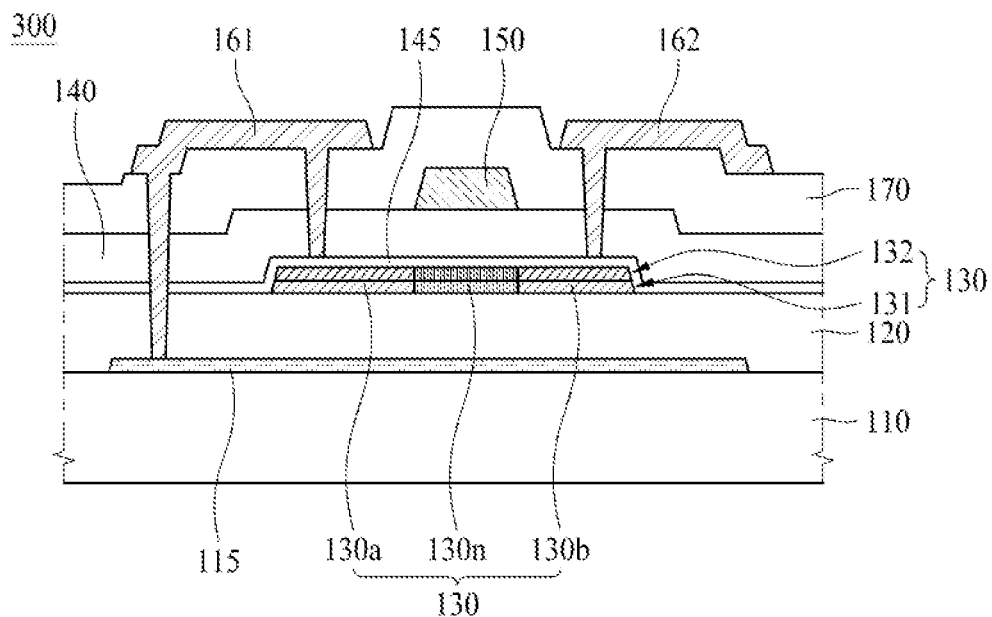
FIG. 3 is a cross-sectional view illustrating a thin film transistor according to still another aspect of the present disclosure.

FIG. 3 is a cross-sectional view illustrating a thin film transistor 300 according to another aspect of the present disclosure.

Referring to FIG. 3, the active layer 130 may include a first oxide semiconductor layer 131 and a second oxide semiconductor layer 132 on the first oxide semiconductor layer 131.

The first oxide semiconductor layer 131 and the second oxide semiconductor layer 132 may include the same semiconductor material, or may include their respective semiconductor materials different from each other.

According to one aspect of the present disclosure, the first oxide semiconductor layer 131 may serve to support the second oxide semiconductor layer 132. Therefore, the first oxide semiconductor layer 131 may be referred to as a support layer.

The first oxide semiconductor layer 131 may be made of an oxide semiconductor material having excellent stability. For example, the first oxide semiconductor layer 131 may include one of an IGZO(InGaZnO)-based oxide semiconductor material [Ga Concentration>In concentration], a GZO(GaZnO)-based oxide semiconductor material, an IGO (InGaO)-based oxide semiconductor material and a GZTO (GaZnSnO)-based oxide semiconductor material, or a combination of at least two thereof.

According to one aspect of the present disclosure, the second oxide semiconductor layer 132 may have excellent mobility characteristics. The second oxide semiconductor layer 132 may have a greater mobility than the first oxide semiconductor layer 131. The second oxide semiconductor layer 132 may serve as a main channel layer.

The second oxide semiconductor layer 132 may include, for example, one of an IGZO(InGaZnO)-based oxide semiconductor material, an IZO(InZnO)-based oxide semiconductor material, an IGZTO(InGaZnSnO)-based oxide semiconductor material, an ITZO(InSnZnO)-based oxide semiconductor material, a ZnO-based oxide semiconductor material, a SIZO(SiInZnO)-based oxide semiconductor material and a ZnON(Zn-oxynitride)-based oxide semiconductor material, or a combination of at least two thereof.

As shown in FIG. 3, a structure in which the active layers 130 and 230 are formed by stacking two semiconductor layers will be referred to as a bi-layer structure. A stacked structure of the active layer 130 shown in FIG. 3 may be applied to other thin film transistors described herein, but still another aspect of the present disclosure is not limited thereto. The active layer 130 may be formed of three or more layers.

Figure 4:
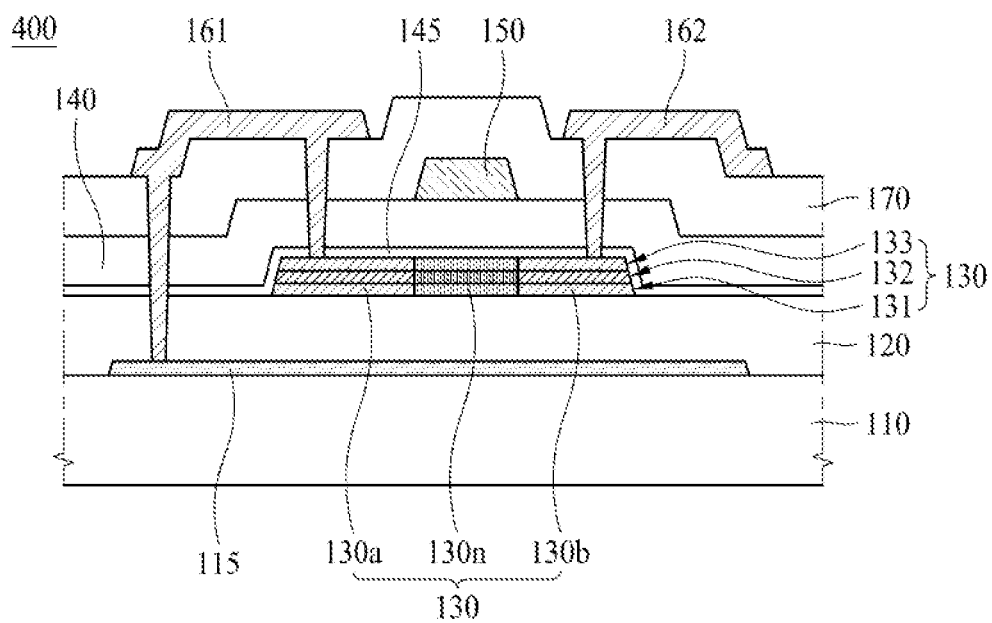
FIG. 4 is a cross-sectional view illustrating a thin film transistor according to further still another aspect of the present disclosure.

FIG. 4 is a cross-sectional view illustrating a thin film transistor 400 according to further still another aspect of the present disclosure.

Referring to FIG. 4, the active layer 130 may further include a third oxide semiconductor layer 133. In detail, the active layer 130 of the thin film transistor 400 according to further still another aspect of the present disclosure may include a third oxide semiconductor layer 133 on the second oxide semiconductor layer 132. The third oxide semiconductor layer 133 may serve to improve interface stability of the active layer 130. The third oxide semiconductor layer 133 may be made of an oxide semiconductor material having excellent stability.

Figure 5:
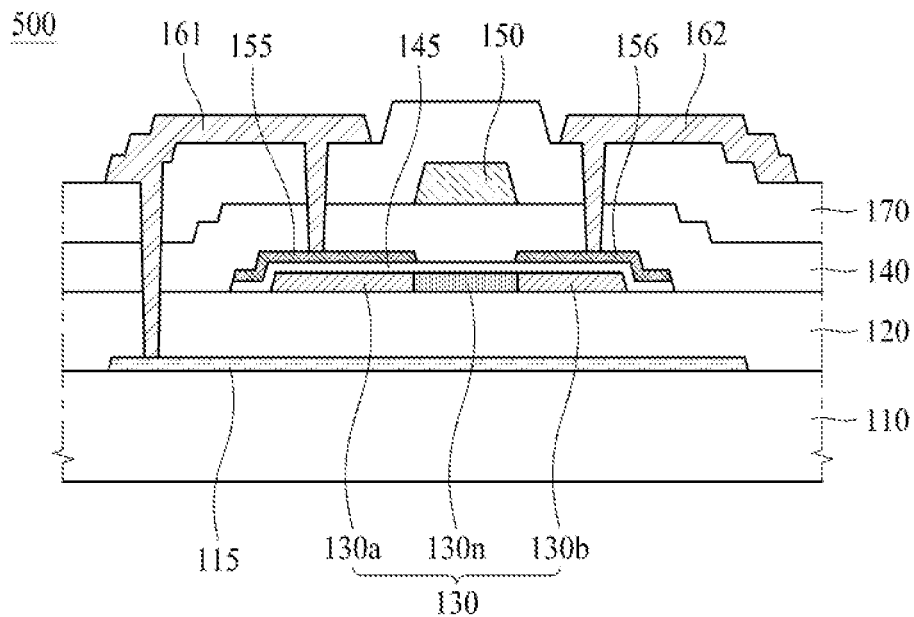
FIG. 5 is a cross-sectional view illustrating a thin film transistor according to further still another aspect of the present disclosure.

FIG. 5 is a cross-sectional view illustrating a thin film transistor 500 according to further still another aspect of the present disclosure.

Referring to FIG. 5, metal layers 155 and 156 may be disposed on the metal oxide layer 145. In more detail, the metal layers 155 and 156 may be disposed on the metal oxide layer 145 that overlaps the first connection portion 130a and the second connection portion 130b.

The metal layers 155 and 156 may include the same metal as that of the metal oxide layer 145. In addition, the metal layers 155 and 156 may include a different kind of metal from the metal oxide layer 145.

According to further still another aspect of the present disclosure, the metal layers 155 and 156 may be formed integrally with the metal oxide layer 145. For example, after a layer made of metal is formed on the entire surface of the substrate 110, the layer may be patterned to form the metal oxide layer 145, which is thin, and the metal layers 155 and 156 thicker than the metal oxide layer 145. At this time, a lower portion of the layer made of metal may be oxidized while partially reducing the active layer 130, and then may become a metal oxide layer. For example, the lower portion of the thick metal layer may be in contact with the active layer 130 and then oxidized while reducing the active layer 130. As a result, the lower metal oxide layer 145 may be formed to be distinguished from the upper metal layers 155 and 156.

The metal layers 155 and 156 may be formed by a separate process after the metal oxide layer 145 is formed.

For example, after the metal oxide layer 145 is formed, the metal layers 155 and 156 may be formed using a reducing metal.

According to one aspect of the present disclosure, the metal layers 155 and 156 may have a thickness of 4 nm to 50 nm. The metal layers 155 and 156 having such a thickness may serve as lines, or may serve as a contact pad that is in contact with the source electrode 161 and the drain electrode 162.

According to one aspect of the present disclosure, the metal layers 155 and 156 may have a reductivity. The metal layers 155 and 156 may selectively reduce the active layer 130. As a result, the active layer 130 may be selectively reduced to form the first connection portion 130a and the second connection portion 130b having electrical conductivity close to a conductor.

The metal layers 155 and 156 may include at least one of aluminum (Al), titanium (Ti) or tantalum (Ta) like the metal oxide layer 145. Also, the metal layers 155 and 156 may include one of zirconium (Zr), hafnium (Hf), vanadium (V), niobium (Nb), rubidium (Rb), cesium (Cs), magnesium (Mg), calcium (Ca), strontium (Sr), lanthanum (La) and palladium (Pd), or a mixture of at least two thereof.

Figure 6:
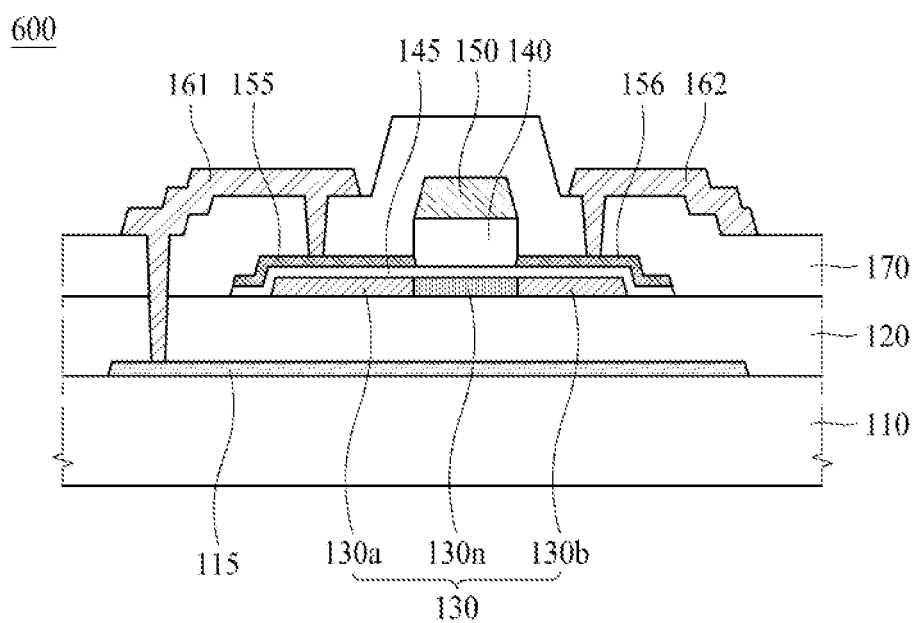
FIG. 6 is a cross-sectional view illustrating a thin film transistor according to further still another aspect of the present disclosure.

FIG. 6 is a cross-sectional view illustrating a thin film transistor 600 according to further still another aspect of the present disclosure.

Referring to FIG. 6, the gate insulating layer 140 may be patterned. In detail, the gate insulating layer 140 may be patterned to correspond to the gate electrode 150. Since the patterning of the gate insulating layer 140 has already been described, the description of the patterning of the gate insulating layer 140 will be omitted to avoid redundancy.

Figure 7:
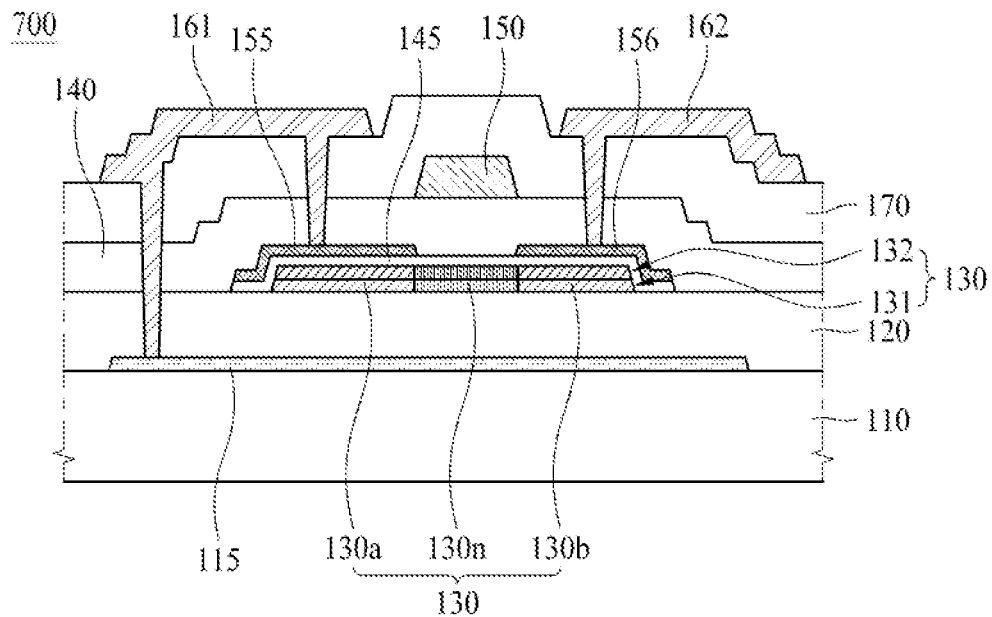
FIG. 7 is a cross-sectional view illustrating a thin film transistor according to further still another aspect of the present disclosure.

FIG. 7 is a cross-sectional view illustrating a thin film transistor 700 according to further still another aspect of the present disclosure.

Referring to FIG. 7, the active layer 130 may include a first oxide semiconductor layer 131 and a second oxide semiconductor layer 132 on the first oxide semiconductor layer 131.

The first oxide semiconductor layer 131 may be made of an oxide semiconductor material having excellent stability. The second oxide semiconductor layer 132 may have excellent mobility characteristics.

Figure 8:
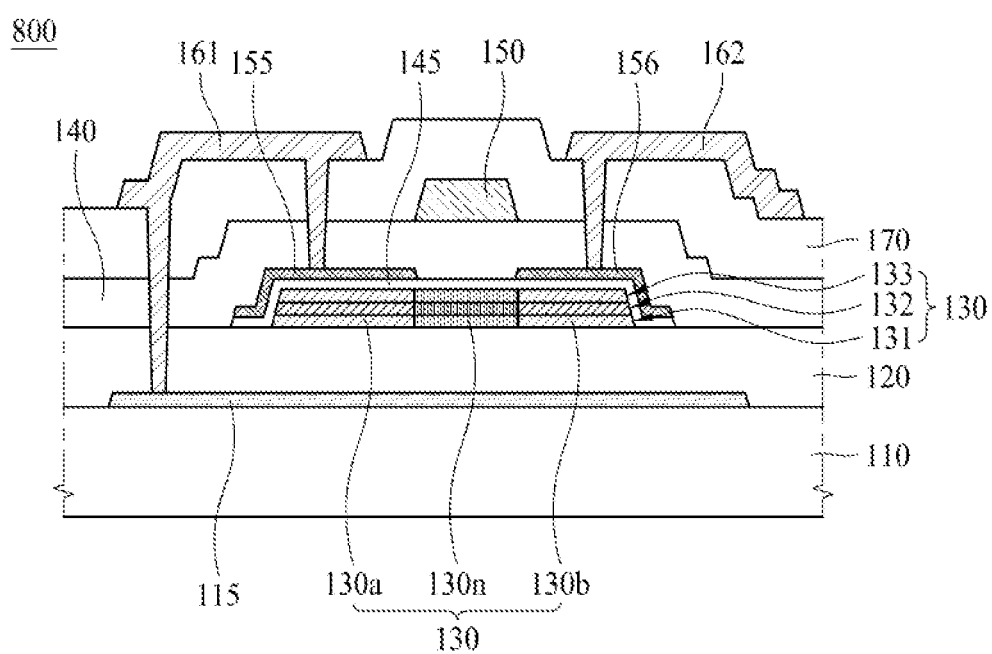
FIG. 8 is a cross-sectional view illustrating a thin film transistor according to further still another aspect of the present disclosure.

FIG. 8 is a cross-sectional view illustrating a thin film transistor 800 according to further still another aspect of the present disclosure.

Referring to FIG. 8, the active layer 130 may include a third oxide semiconductor layer 133 on the second oxide semiconductor layer 132.

The third oxide semiconductor layer 133 may serve to improve interface stability of the active layer 130. The third oxide semiconductor layer 133 may be made of an oxide semiconductor material having excellent stability.

Hereinafter, a display device including the thin film transistors 100, 201, 202, 300, 400, 500, 600, 700 and 800 described above will be described in detail.

Figure 9:
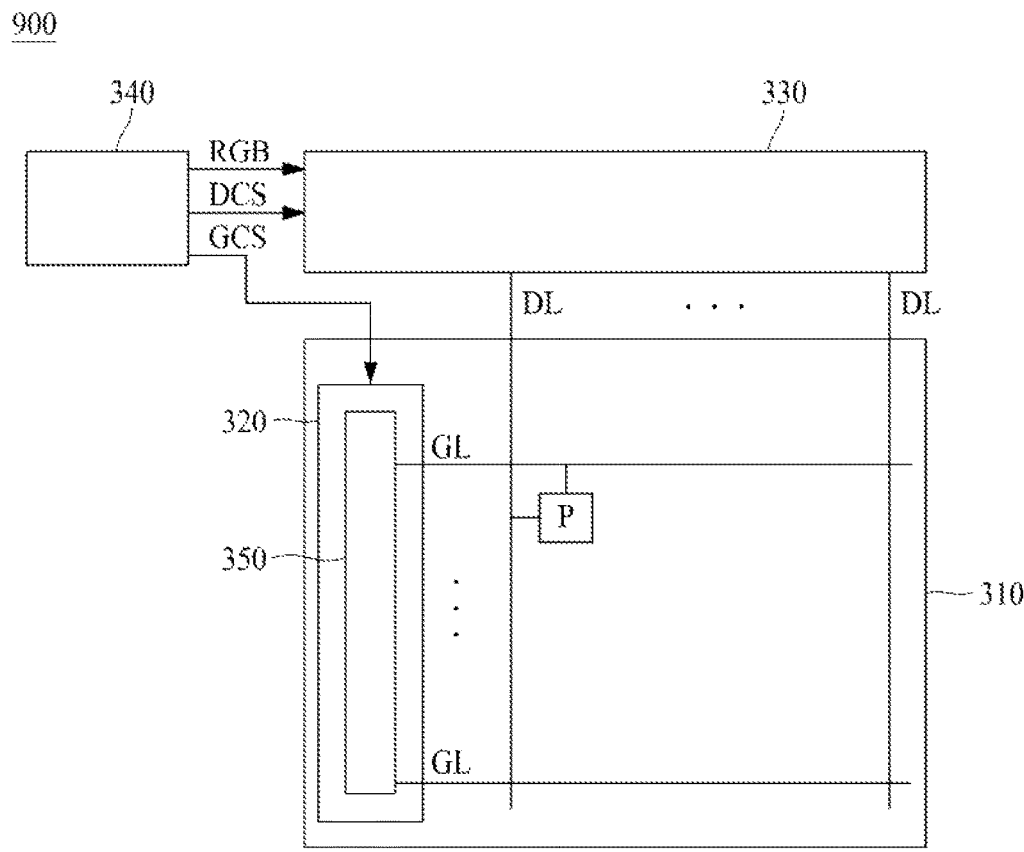
FIG. 9 is a schematic view illustrating a display device according to one aspect of the present disclosure.

FIG. 9 is a schematic view illustrating a display device 900 according to further still another aspect of the present disclosure.

Figure 10:
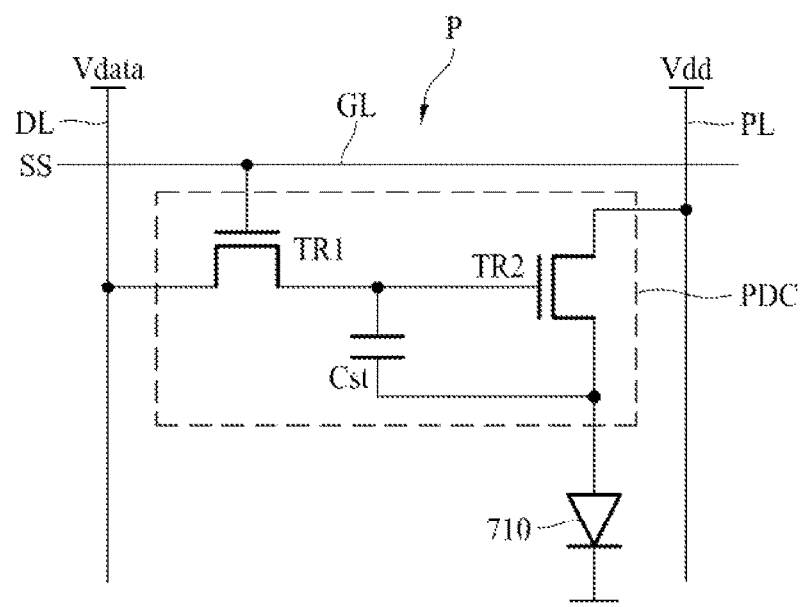
FIG. 10 is a circuit diagram illustrating any one pixel of FIG. 9.

As shown in FIG. 10, the display device 900 includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P The controller 340 controls the gate driver 320 and the data driver 330.

The controller 340 outputs a gate control signal GCS for controlling the gate driver 320 and a data control signal DCS for controlling the data driver 330 by using a signal that is supplied from an external system(not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage that may turn on a switching element (thin film transistor) disposed in the pixel P.

Also, the shift register 350 supplies a gate-off signal capable of turning off a switching element, to the gate line GL for the other period of one frame, in which the gate pulse is not supplied. Hereinafter, the gate pulse and the gate-off signal will collectively be referred to as a scan signal SS or Scan.

According to one aspect of the present disclosure, the gate driver 320 may be packaged on the display panel 310. In this way, a structure in which the gate driver 320 is directly packaged on the display panel 310 will be referred to as a Gate In Panel (GIP) structure.

Figure 11:
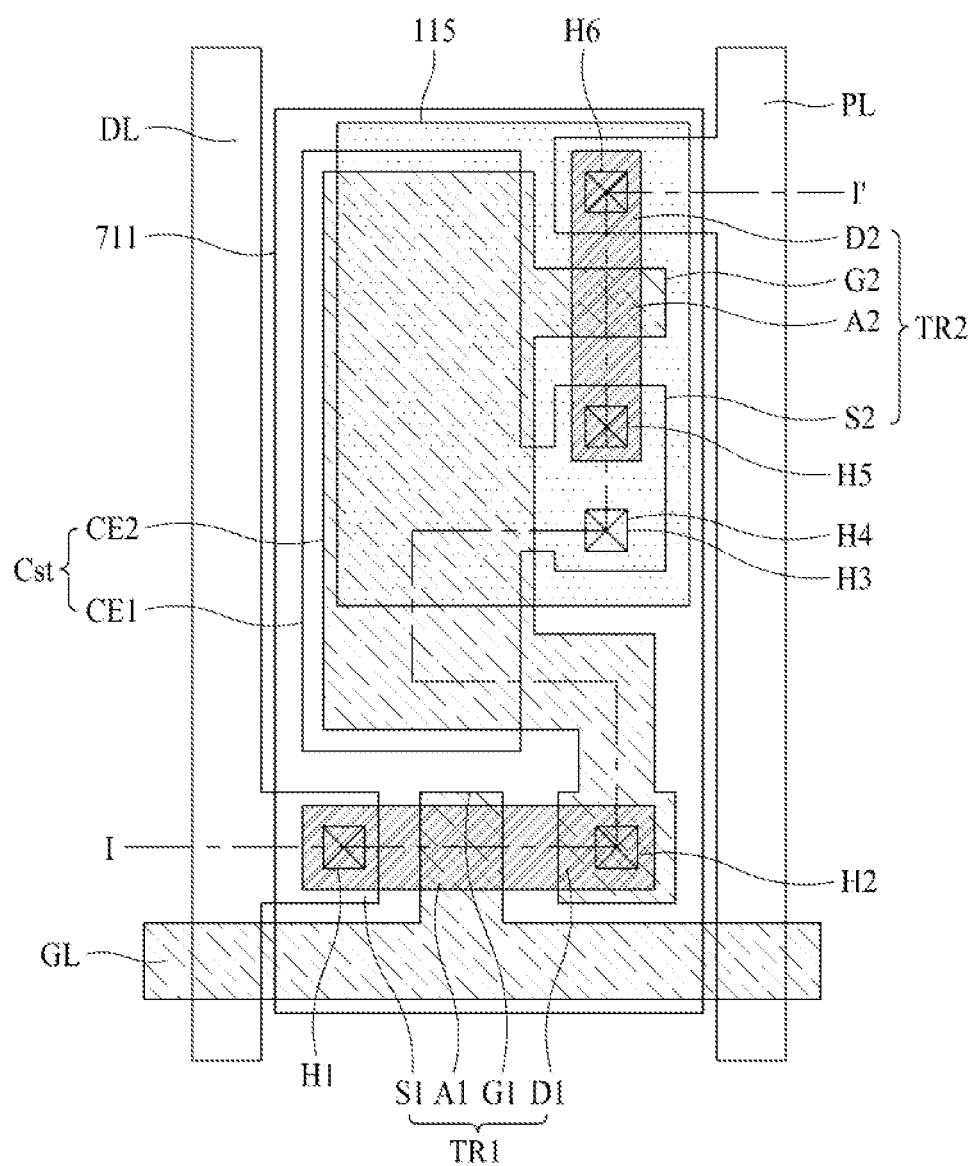
FIG. 11 is a plan view illustrating the pixel of FIG. 10.
Figure 12:
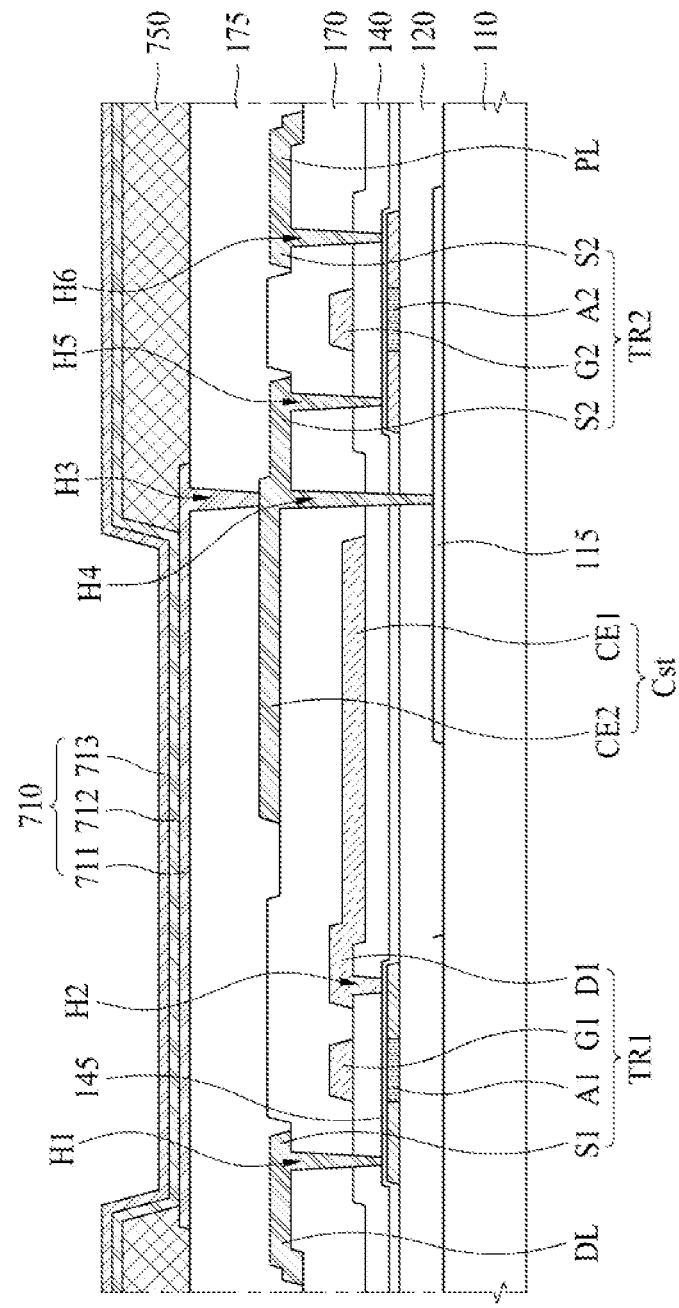
FIG. 12 is a cross-sectional view taken along line I-I' of FIG. 11.

FIG. 10 is a circuit diagram illustrating any one pixel P of FIG. 9, FIG. 11 is a plan view illustrating the pixel P of FIG. 10 and FIG. 12 is a cross-sectional view taken along line I-I of FIG. 11.

The circuit diagram of FIG. 10 is an equivalent circuit diagram for a pixel P of a display device 900 that includes an organic light emitting diode(OLED) as a display element 710.

The pixel P includes a display element 710 and a pixel driving circuit PDC for driving the display element 710.

The pixel driving circuit PDC of FIG. 10 includes a first thin film transistor TR1 that is a switching transistor and a second thin film transistor TR2 that is a driving transistor.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode of the second thin film transistor TR2 connected with the display element 710. The data voltage Vdata is charged in a first capacitor C1 formed between the gate electrode and a source electrode of the second thin film transistor TR2.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 11 and 12, the first thin film transistor TR1, the second thin film transistor TR2, and a storage capacitor Cst are disposed on the substrate 110.

A thin film transistor TFT of the thin film transistors 100, 201, 202, 300, 400, 500, 600, 700 and 800 described above may be applied to at least one of the first thin film transistor TR1 or the second thin film transistor TR2 of the display device 900.

The substrate 110 may be made of glass or plastic. Plastic having a flexible property, for example, polyimide (PI) may be used as the substrate 110.

A light shielding layer 115 is disposed on the substrate 110.

The light shielding layer 115 may have light shielding characteristics. The light shielding layer may shield light incident from the outside to protect an active layer A2.

A buffer layer 120 is disposed on the light shielding layer 115. The buffer layer 120 is made of an insulating material, and protects the active layers A1 and A2 from external water or oxygen.

The active layer A1 of the first thin film transistor TR1 and the active layer A2 of the second thin film transistor TR2 are disposed on the buffer layer 120. For example, each of the active layers A1 and A2 may include an oxide semiconductor material.

A metal oxide layer 145 is disposed on the active layers A1 and A2. The metal oxide layer 145 may include at least one of aluminum (Al), titanium (Ti) or tantalum (Ta).

According to further still another aspect of the present disclosure, the metal oxide layer 145 may serve to protect the active layer 130.

The metal oxide layer 145 may cover the upper surface and sides of the active layer 130. The metal oxide layer 145 may serve to complement the gate insulating layer 140.

The metal oxide layer 145 may be extended to the upper portion of the buffer layer 120 as well as the upper and sides of the active layer 130. The metal oxide layer 145 may be patterned or not.

A gate insulating layer 140 is disposed on the metal oxide layer 145.

Gate electrodes G1 and G2 and a gate line GL are disposed on the gate insulating layer 140. The gate electrode G1 of the first thin film transistor TR1 may be integrally formed with the gate line GL to have a structure extended from the gate line GL.

A drain electrode D1 of the first thin film transistor TR1 may be disposed on the gate insulating layer 140. The drain electrode D1 of the first thin film transistor TR1 may be connected to the active layer A1 of the first thin film transistor TR1 through a second contact hole H2.

The drain electrode D1 of the first thin film transistor TR1 may be formed of the same material as that of the gate electrodes G1 and G2.

A first capacitor electrode CE1 is disposed on the gate insulating layer 140. The first capacitor electrode CE1 may be integrally formed with the drain electrode D1 of the first thin film transistor TR1. The drain electrode D1 of the first thin film transistor TR1 may be extended to become the first capacitor electrode CE1.

The first capacitor electrode CE1 may be integrally formed with the gate electrode G2 of the second thin film transistor TR2. The first capacitor electrode CE1 may be extended to become the gate electrode G2 of the second thin film transistor TR2.

According to further still another aspect of the present disclosure, the drain electrode D1 of the first thin film transistor TR1, the first capacitor electrode CE1, and the gate electrode G2 of the second thin film transistor TR2 may be integrally formed.

An interlayer insulating layer 170 is disposed on the gate electrodes G1 and G2, the drain electrode D1 of the first thin film transistor TR1 and the first capacitor electrode CE1. The interlayer insulating layer 170 may have a single layered structure, or may have a multi-layered structure.

The data line DL, the driving power line PL, source electrodes S1 and S2, the drain electrode D2 of second thin film transistor TR2, and a second capacitor electrode CE2 may be disposed on the interlayer insulating layer 170.

The source electrode S1 of the first thin film transistor TR1 may be integrated with the data line DL. A portion of the data line DL may be extended to become the source electrode S1 of the first thin film transistor TR1.

The source electrode S1 of the first thin film transistor TR1 may be connected to the active layer A1 of the first thin film transistor TR1 through a first contact hole H1.

The drain electrode D2 of the second thin film transistor TR2 may be integrated with the driving power line PL. A portion of the driving power line PL may be extended to become the drain electrode D2 of the second thin film transistor TR2.

The drain electrode D2 of the second thin film transistor TR2 may be connected to the active layer A2 of the second thin film transistor TR2 through a sixth contact hole H6.

The source electrode S2 of the second thin film transistor TR2 may be connected to the active layer A2 of the second thin film transistor TR2 through a fifth contact hole H5.

The source electrode S2 of the second thin film transistor TR2 may be extended to form the second capacitor electrode CE2. The source electrode S2 of the second thin film transistor TR2 may be integrally formed with the second capacitor electrode CE2.

The source electrode S2 of the second thin film transistor TR2 may be connected to the light shielding layer 115 below the second thin film transistor TR2 through a fourth contact hole h4. In this case, the same voltage equal to that applied to the source electrode S2 of the second thin film transistor TR2 may be applied to the light shielding layer 115.

The light shielding layer 115 connected to the source electrode S2 of the second thin film transistor TR2 may serve as a capacitor electrode.

According to further still another aspect of the present disclosure, a storage capacitor Cst is formed by the first capacitor electrode CE1 and the second capacitor electrode CE2, which overlap each other. Further, an additional capacitor may be formed by the first capacitor electrode CE1 and the light shielding layer 115, which overlap each other.

A planarization layer 175 is disposed on the data line DL, the driving power line PL, the source electrodes S1 and S2, the drain electrode D2 of the second thin film transistor TR2 and the second capacitor electrode CE2.

The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 may be connected to the source electrode S2 of the second thin film transistor TR2 through the third contact hole H3 formed in the planarization layer 175.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 12 is an organic light emitting diode OLED. Therefore, the display device 100 according to one aspect of the present disclosure is an organic light emitting display device.

Figure 13:
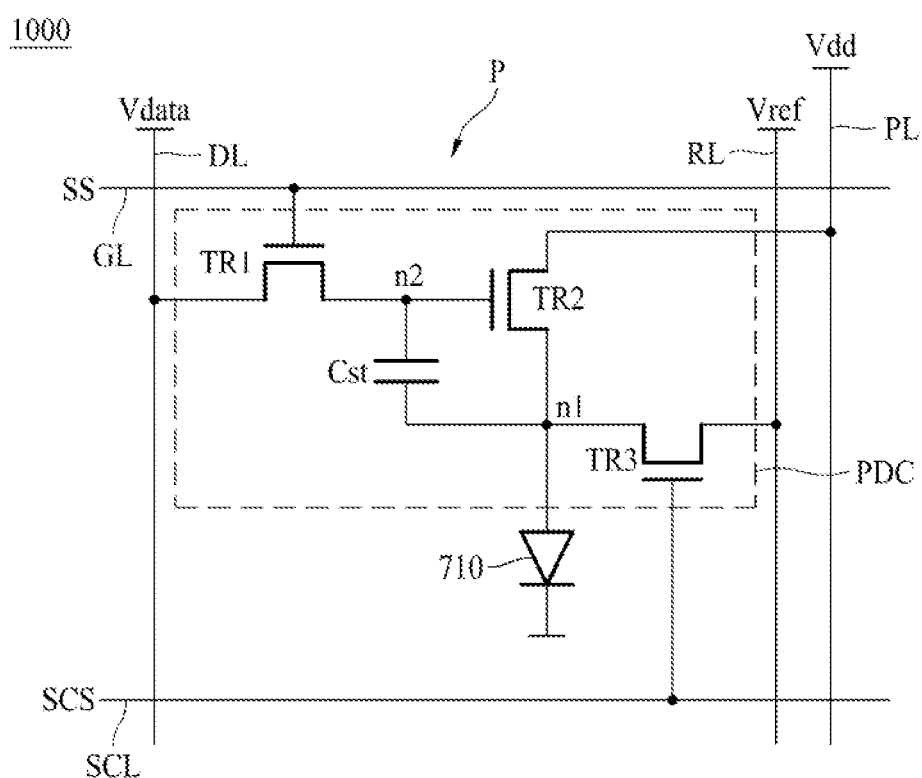
FIG. 13 is a circuit diagram illustrating any one pixel of a display device according to another aspect of the present disclosure.

FIG. 13 is a circuit diagram illustrating any one pixel of a display device according to another aspect of the present disclosure.

FIG. 13 is an equivalent circuit diagram illustrating a pixel P of an organic light emitting display device.

The pixel P of the display device 1000 shown in FIG. 13 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

The first thin film transistor TR1 is turned on by the scan signal SS supplied to the gate line GL to transmit the data voltage Vdata, which is supplied to the data line DL, to the gate electrode of the second thin film transistor TR2.

A storage Cst is positioned between the gate electrode of the second thin film transistor TR2 and the display element 710.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode of the second thin film transistor TR2 is connected with the first thin film transistor TR1. The storage capacitor Cst is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the storage capacitor Cst formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 14:
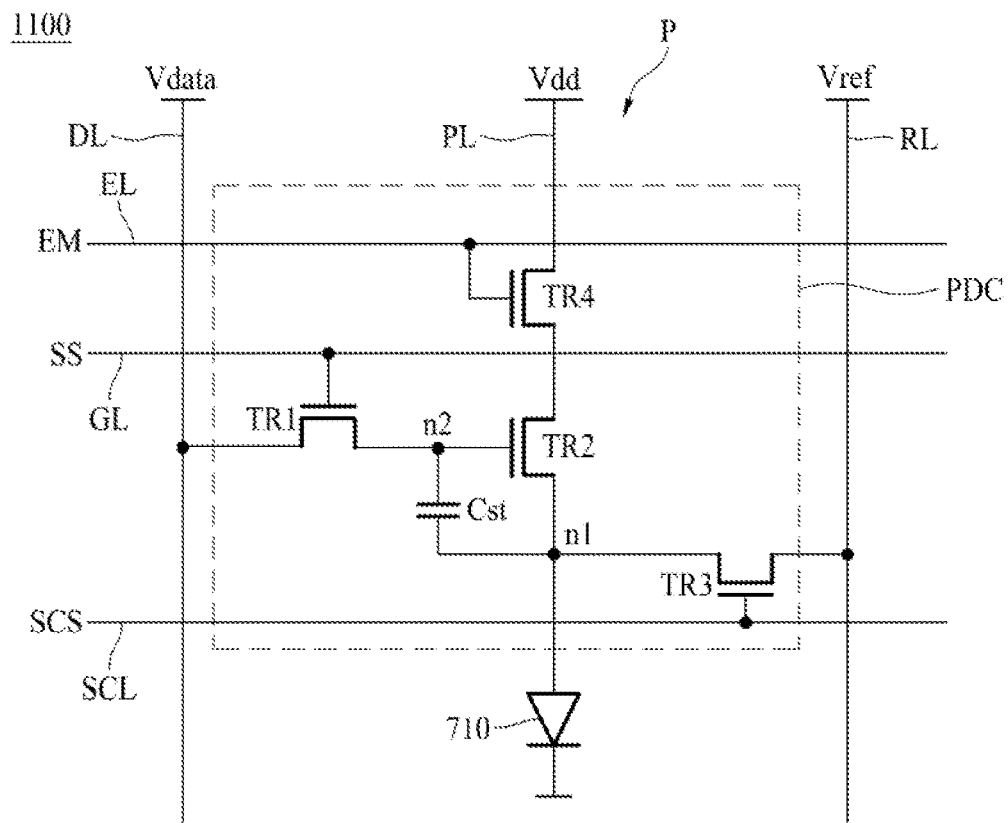
FIG. 14 is a circuit diagram illustrating any one pixel of a display device according to still another aspect of the present disclosure.

FIG. 14 is a circuit diagram illustrating a pixel of a display device 1100 according to further still another aspect of the present disclosure.

The pixel P of the display device 1100 shown in FIG. 14 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 13, the pixel P of FIG. 14 further includes an emission control line EL. An emission control signal EM is supplied to the emission control line EL.

Also, the pixel driving circuit PDC of FIG. 14 further includes a fourth thin film transistor TR4 that is an emission control transistor for controlling a light emission timing of the second thin film transistor TR2, in comparison with the pixel driving circuit PDC of FIG. 13.

A storage capacitor Cst is positioned between the gate electrode of the second thin film transistor TR2 and the display element 710.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to the reference line RL and thus turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to further still another aspect of the present disclosure may be formed in various structures in addition to the above-described structure. The pixel driving circuit PDC may include, for example, five or more thin film transistors.

Figure 15:
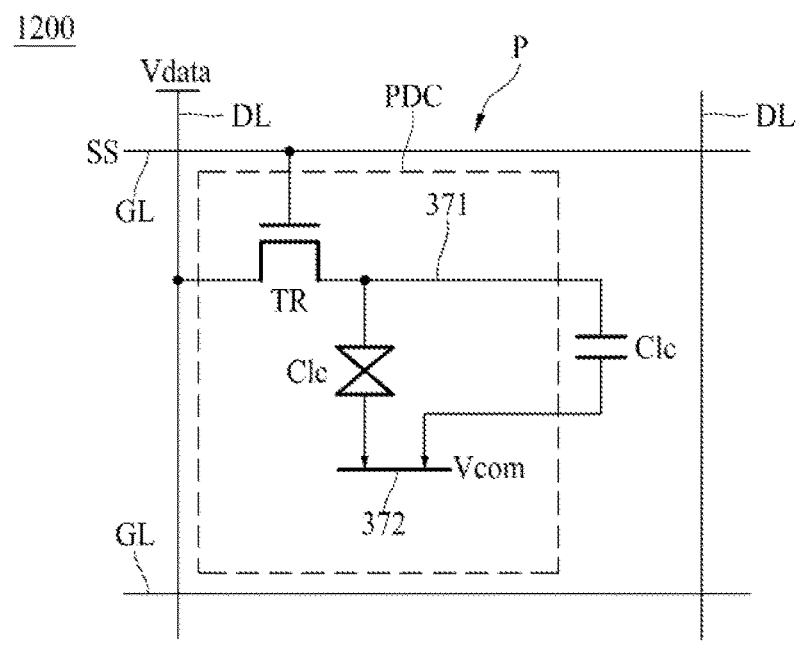
FIG. 15 is a circuit diagram illustrating any one pixel of a display device according to further still another aspect of the present disclosure.

FIG. 15 is a circuit diagram illustrating a pixel P of a display device 1200 according to further still another aspect of the present disclosure.

The display device 1200 of FIG. 15 is a liquid crystal display device.

The pixel P of the display device 1200 shown in FIG. 15 includes a pixel driving circuit PDC and a liquid crystal capacitor Clc connected with the pixel driving circuit PDC. The liquid crystal capacitor Clc corresponds to the display element.

The pixel driving circuit PDC includes a thin film transistor TR connected with the gate line GL and the data line DL, and a storage capacitor Cst connected between the thin film transistor TR and a common electrode 372. The liquid crystal capacitor Clc is connected with the storage capacitor Cst in parallel between the thin film transistor TR and the common electrode 372.

The liquid crystal capacitor Clc charges a differential voltage between a data signal supplied to a pixel electrode 371 through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor Clc.

At least one of the thin film transistors 100, 201, 202 300, 400, 500, 700 and 800 shown in FIGS. 1 to 8 may be applied to the thin film transistor TR of the display device 1200 according to further still another aspect of the present disclosure.

According to the present disclosure, the following advantageous effects may be obtained.

According to one aspect of the present disclosure, since the metal oxide layer having a thin thickness is disposed on the surface of the active layer, the active layer may be effectively protected, whereby the thin film transistor may have excellent stability.

According to one aspect of the present disclosure, since the metal oxide layer having a thin thickness is disposed on the surface of the active layer, stability of the thin film transistor may be improved, whereby a quality deviation may be reduced. As a result, the thin film transistors may have uniform quality.

In addition, according to one aspect of the present disclosure, the metal oxide layer may serve to prevent hydrogen of the gate insulating layer or other insulating layer from affecting the active layer. In detail, the metal oxide layer may serve as a blocking layer. As the metal oxide layer blocks hydrogen, the conductorization permeation depth may be prevented from being extended to the channel portion of the active layer. As a result, a process error may be avoided when the channel portion is designed, and even though the length of the channel portion is designed to be short, the thin film transistor may maintain excellent driving characteristics.

Since oxygen vacancy may be partially generated in the active layer by the metal included in the metal oxide layer, an effect that carriers are supplied to the active layer may be occurred. As a result, mobility of the active layer may be improved.

The display device according to one aspect of the present disclosure includes the above thin film transistor having excellent stability and excellent quality uniformity, thereby has excellent display quality and uniformity of display quality.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A thin film transistor comprising:
an active layer;
a metal oxide layer disposed on the active layer;
a gate insulating layer disposed on the metal oxide layer;
a gate electrode disposed on the gate insulating layer;
a source electrode electrically connected to the active layer; and
a drain electrode spaced apart from the source electrode and electrically connected to the active layer,
wherein the metal oxide layer is disposed between the active layer and the gate insulating layer, and the metal oxide layer directly contacts with both the active layer and the gate insulating layer,
wherein at least one of the source electrode or the drain electrode is in directly contacts with the metal oxide layer, and
the at least one of the source electrode or the drain electrode is connected to the active layer by a metal insulator semiconductor (MIS) contact,
wherein the at least one of the source electrode or the drain electrode is not in direct contact with the active layer, and the metal oxide layer is between the active layer and the at least one of the source electrode or the drain electrode, and
wherein the metal oxide layer has a thickness of 1 nm to 3 nm.

2. The thin film transistor of claim 1, wherein the metal oxide layer includes one of aluminum (Al), titanium (Ti), tantalum (Ta), zirconium (Zr), hafnium (Hf), vanadium (V), niobium (Nb), rubidium (Rb), cesium (Cs), magnesium (Mg), calcium (Ca), strontium (Sr), lanthanum (La) and palladium (Pd), or a mixture of at least two thereof.

3. The thin film transistor of claim 1, wherein the metal oxide layer covers at least a portion of an upper surface of the active layer.

4. The thin film transistor of claim 1, wherein the metal oxide layer covers an upper surface and sides of the active layer.

5. The thin film transistor of claim 1, wherein the active layer includes a channel portion, a first connection portion and a second connection portion, and the metal oxide layer is disposed between the channel portion and the gate insulating layer.

6. The thin film transistor of claim 1, wherein the active layer includes a metal oxide semiconductor material.

7. The thin film transistor of claim 1, wherein the active layer includes:
a first oxide semiconductor layer; and
a second oxide semiconductor layer on the first oxide semiconductor layer,
wherein the second oxide semiconductor layer has a higher mobility than the first oxide semiconductor layer.

8. The thin film transistor of claim 7, wherein the active layer further includes a third oxide semiconductor layer disposed on the second oxide semiconductor layer.

9. A display device comprising the thin film transistor of claim 1.

10. The thin film transistor of claim 1,
wherein the source electrode and the drain electrode are not in direct contact with the active layer.

* * * * *